(12) United States Patent
Herrmann et al.

(10) Patent No.: US 10,669,765 B2
(45) Date of Patent: Jun. 2, 2020

(54) METHODS FOR CONTROLLING A CAPACITIVE ANTI-TRAP SYSTEM AND ANTI-TRAP SYSTEM

(71) Applicant: Brose Fahrzeugteile GmbH & Co. Kommanditgesellschaft, Hallstadt, Hallstadt (DE)

(72) Inventors: Christian Herrmann, Coburg (DE); Florian Pohl, Ebersdorf (DE); Holger Wuerstlein, Zeil am Main (DE)

(73) Assignee: BROSE FAHRZEUGTEILE GMBH & CO. KOMMANDITGESELLSCHAFT, HALLSTADT, Hallstadt (DE)

( * ) Notice: Subject to any disclaimer, the term of this patent is extended or adjusted under 35 U.S.C. 154(b) by 778 days.

(21) Appl. No.: 14/418,890

(22) PCT Filed: Aug. 1, 2013

(86) PCT No.: PCT/EP2013/002291
§ 371 (c)(1),
(2) Date: Jun. 8, 2015

(87) PCT Pub. No.: WO2014/019695
PCT Pub. Date: Feb. 6, 2014

(65) Prior Publication Data
US 2015/0275561 A1    Oct. 1, 2015

(30) Foreign Application Priority Data
Aug. 2, 2012  (DE) .................. 10 2012 107 115

(51) Int. Cl.
*H03K 17/955* (2006.01)
*E05F 15/46* (2015.01)

(52) U.S. Cl.
CPC .......... *E05F 15/46* (2015.01); *H03K 17/955* (2013.01); *H03K 2217/960775* (2013.01)

(58) Field of Classification Search
CPC .................................................. H03K 17/955
(Continued)

(56) References Cited

U.S. PATENT DOCUMENTS 4,031,462 A * 6/1977 Bouvier ............. G01R 23/16
324/76.15
4,712,200 A * 12/1987 Cassou ............... G01S 15/8902
367/106
(Continued)

FOREIGN PATENT DOCUMENTS

| CN | 1711550 A | 12/2005 |
|---|---|---|
| CN | 101636908 A | 1/2010 |

(Continued)

OTHER PUBLICATIONS

English translation of the Written Opinion of the International Searching Authority, corresponding to International Application No. PCT/EP2013/002291, 12 pages.
(Continued)

*Primary Examiner* — Charles A Fox
*Assistant Examiner* — Michael E Butler
(74) *Attorney, Agent, or Firm* — Lewis Roca Rothgerber Christie LLP

(57) ABSTRACT

The present invention relates to methods for controlling a capacitive anti-trap system of a vehicle. At least two transmission electrodes and one reception electrode of the capacitive anti-trap system are used for detecting an obstacle, and an electrical field is generated by a pair comprising transmission electrode and reception electrode by actuation of the respective transmission electrode by alternating electric current, said electrical field being influenced by an obstacle
(Continued)

such that an electrical capacitance is measurably changed. A changing electrical capacitance is determinable on the basis of a signal received via the reception electrode and this signal is evaluated by means of an electronic evaluation unit at least during closing of the vehicle closing element in order to determine the presence of an obstacle in the displacement path of the vehicle closing element.

13 Claims, 5 Drawing Sheets

(58) Field of Classification Search
USPC .......................................................... 701/49
See application file for complete search history.

(56) References Cited

U.S. PATENT DOCUMENTS

| | | | |
|---|---|---|---|
| 5,844,415 A * | 12/1998 | Gershenfeld | B60N 2/002 324/663 |
| 7,821,275 B2 | 10/2010 | Wuerstlein et al. | |
| 7,969,166 B2 | 6/2011 | Fasshauer | |
| 2002/0154039 A1 | 10/2002 | Lambert et al. | |
| 2003/0233183 A1* | 12/2003 | Nuber | E05F 15/46 701/49 |
| 2005/0154530 A1* | 7/2005 | Hosokawa | B60R 21/013 701/301 |
| 2007/0035156 A1 | 2/2007 | Compton et al. | |
| 2007/0139049 A1 | 6/2007 | Van Berkel | |
| 2009/0033342 A1 | 2/2009 | Richter | |
| 2009/0164123 A1* | 6/2009 | Moriguchi | G05D 1/0227 701/301 |
| 2009/0219039 A1* | 9/2009 | Fasshauer | G01V 3/088 324/682 |
| 2010/0024301 A1* | 2/2010 | Wuerstlein | H03K 17/955 49/28 |
| 2010/0060471 A1 | 3/2010 | Hammerschmidt | |
| 2010/0060489 A1* | 3/2010 | Fasshauer | H03K 17/955 341/20 |
| 2011/0041409 A1* | 2/2011 | Newman | H03K 17/955 49/324 |
| 2011/0316304 A1* | 12/2011 | Schwaiger | H03K 17/955 296/107.01 |
| 2013/0187705 A1 | 7/2013 | Kaltner et al. | |
| 2013/0193989 A1* | 8/2013 | Kuhnen | G01B 7/023 324/662 |
| 2013/0207667 A1 | 8/2013 | Zibold et al. | |
| 2013/0291439 A1 | 11/2013 | Wuerstlein et al. | |
| 2013/0307567 A1* | 11/2013 | Bolbocianu | G01V 3/02 324/661 |
| 2015/0077141 A1* | 3/2015 | Russ | H03K 17/955 324/676 |
| 2015/0267454 A1* | 9/2015 | Wuerstlein | E05F 15/60 701/49 |
| 2015/0275561 A1* | 10/2015 | Herrmann | H03K 17/955 701/49 |
| 2015/0369941 A1* | 12/2015 | Pribisic | E05F 15/46 324/658 |
| 2016/0245671 A1* | 8/2016 | Wuerstlein | G01D 5/2405 |
| 2017/0075019 A1* | 3/2017 | Pribisic | E05F 15/73 |
| 2017/0122927 A1* | 5/2017 | Koizumi | H03K 17/955 |
| 2017/0138997 A1* | 5/2017 | Wuerstlein | G01R 31/04 |
| 2017/0194960 A1* | 7/2017 | Bextermoeller | H03K 17/955 |

FOREIGN PATENT DOCUMENTS

| | | |
|---|---|---|
| DE | 195 49 314 A1 | 7/1997 |
| DE | 10 2007 026 307 A1 | 2/2008 |
| DE | 20 2006 015 740 U1 | 3/2008 |
| DE | 10 2006 056 240 A1 | 5/2008 |
| DE | 10 2007 001 688 A1 | 10/2008 |

OTHER PUBLICATIONS

Chinese Office action dated Nov. 30, 2017 cited in corresponding Chinese Patent Application No. 201380041090.2, with an English Search Report, 14 pages.
Chinese Office action dated Oct. 10, 2016 issued in corresponding Patent Application No. 201380041090.2, (15 pages), with English translation (19 pages).

* cited by examiner

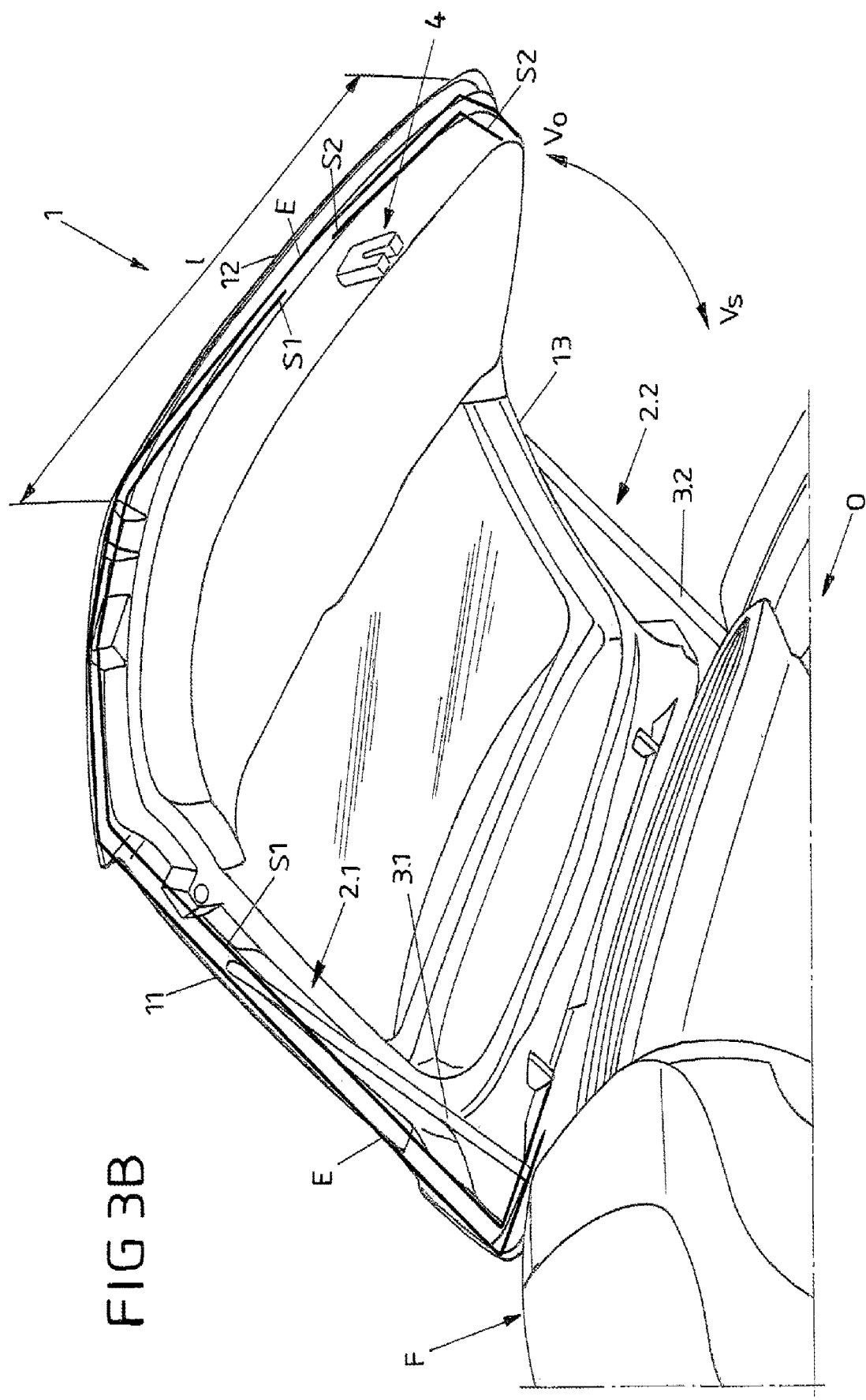

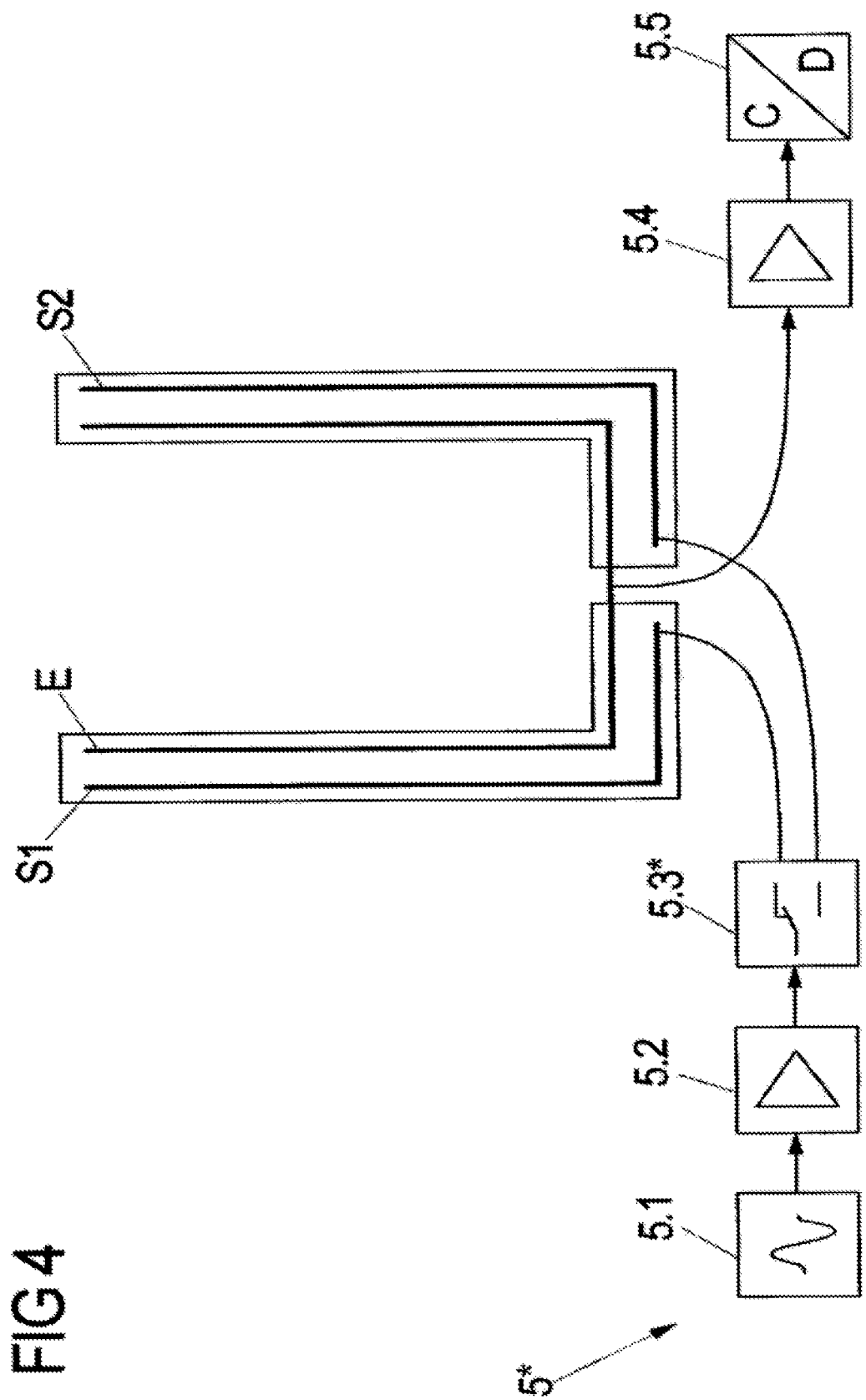

METHODS FOR CONTROLLING A CAPACITIVE ANTI-TRAP SYSTEM AND ANTI-TRAP SYSTEM

CROSS-REFERENCE TO A RELATED APPLICATION

This application is a National Phase Patent Application of International Patent Application Number PCT/EP2013/002291, filed on Aug. 1, 2013, which claims priority of German Patent Application Number 10 2012 107 115.2, filed on Aug. 2, 2012.

BACKGROUND

The present invention relates to a method for controlling a capacitive anti-trap system and to a capacitive anti-trap system.

In the case of vehicle closing elements which are displaceable increasingly actuated by external force, in particular driven by a motor, there is a considerable risk during closing of the respective vehicle closing element of a body part of a person standing close to the vehicle being trapped, for example, which can result in considerable injury. For this reason, in capacitive anti-trap systems which are well known per se for vehicles, in particular for motor vehicles, an obstacle in the displacement path of a vehicle closing element to be closed driven by a motor is detected contactlessly by a changing electrical capacitance and an obstacle is prevented from being trapped between the closing vehicle closing element and a vehicle structure in the region of a vehicle body opening which is intended to be closed by the vehicle closing element in a closed position. Such a vehicle closing element may be, for example, a side door, a tailgate, a trunk lid, a window pane or a sliding roof of a motor vehicle.

In comparison with purely tactile anti-trap systems, anti-trap systems with capacitive identification have the advantage that any obstacle can be determined even before contact with the vehicle closing element or even shortly thereafter without a certain force needing to act on the sensor system of the anti-trap system in order that the system is triggered and the displacement movement of the vehicle closing element is stopped and/or reversed.

In the case of capacitive anti-trap systems on which the present invention is based, use is made of the fact that, in the case of an electrode arrangement of the anti-trap system consisting of at least one transmission electrode and one reception electrode, a signal which is characteristic of the presence of an obstacle can be received at the reception electrode when the transmission electrode is actuated by alternating electric current. Thus, owing to actuation of the transmission electrode by alternating current, an electrical field is generated which is influenced by an obstacle such that an electrical capacitance is measurably changed. This measurable change in the electrical capacitance is measurable at the reception electrode, which is arranged spaced apart from the transmission electrode, and can be evaluated on the basis of a signal received from the measurement electrode, generally a voltage signal, in order to trigger the anti-trap system and to influence the displacement movement of the vehicle closing element.

In the case of a vehicle closing element with a comparatively large area, such as, for example, a tailgate of a motor vehicle, generally a plurality of electrode arrangements are provided spaced physically apart from one another in order to monitor precisely regions in which the trapping of an obstacle is particularly critical in a targeted manner. It is also possible for easier fitting for individual electrode arrangements to be constructed separately from one another.

For example, US 2007/0035156 A1 describes an anti-trap system in which two electrode arrangements, each having a transmission electrode and a reception electrode, are provided on mutually opposite closing edges, on the longitudinal side, of a vehicle tailgate. The individual electrode pairs define in each case one monitoring region on a closing edge of the tailgate in which an obstacle in the displacement path of the closing tailgate is detectable. The actuation and evaluation the two electrode pairs in this case takes place separately, in each case. An electronic evaluation unit of the anti-trap system from US 2007/0035156 A1 therefore always receives at least two signals, on the basis of which the electronic evaluation unit needs to draw a conclusion on the presence of an obstacle in one monitoring region or the other.

However, such a separate evaluation in respect of the presence of an obstacle in different monitoring regions can be comparatively complex, on the one hand, and can make a capacitive anti-trap system comparatively slow, on the other hand. Thus, in the case of capacitive anti-trap systems which only provide a single signal generator by means of which the respectively used transmission electrodes are actuated by an alternating electric current of predetermined amplitude and frequency for reasons of costs, for example, (measurement) signals received at the reception electrode or the reception electrodes can only be evaluated by an electronic evaluation unit in temporal succession in order to determine a possible obstacle in the displacement path of the vehicle closing element.

SUMMARY

The present invention is therefore based on the object of improving a capacitive anti-trap system of the type mentioned at the outset further and in particular of providing an improved possibility for evaluation in the case of two transmission electrodes spaced apart from one another of a capacitive anti-trap system.

In accordance with the method described herein for controlling a capacitive anti-trap system, such as, for example, a tailgate of a motor vehicle, provision is made for the two transmission electrodes which are spaced physically apart from one another and which each interact with at least one reception electrode to be actuated simultaneously by alternating electric current such that it is possible to assess whether an obstacle is present in the displacement path of the closing vehicle closing element in one of two monitoring regions provided by the two transmission electrodes by means of an electronic evaluation unit of the anti-trap system on the basis of a single received signal.

The manner in which the two transmission electrodes are actuated by alternating current therefore makes it possible, according to the invention, for it to be possible to evaluate automatically whether an obstacle is present in the displacement path of the vehicle closing element despite simultaneous actuation of the two transmission electrodes on the basis of a single received signal, preferably a voltage signal, by means of an electronic evaluation unit and the evaluation logic inherent thereto. In a variant embodiment according to the invention in accordance with the method from claim 1, therefore, it is possible to determine in automated fashion whether an obstacle is present in one of two monitoring regions of the capacitive anti-trap system which are separated physically from one another on the basis of a single received signal so that the displacement movement of the vehicle closing element needs to be stopped and/or reversed.

In contrast to the prior art, for example US 2007/0035156 A1, no evaluation of a plurality of temporally successive signals of two reception electrodes in which the regions monitored by an electrode pair are interrogated successively is therefore necessary in the method according to the invention as described herein. Instead, in the method as described herein, simultaneous evaluation of the two monitoring regions takes place.

In a variant embodiment which is considered to be advantageous, the actuation of the two transmission electrodes by alternating electric current is performed simultaneously and furthermore in such a way that it is possible to assess in which of the transmission regions an obstacle is present by means of the electronic evaluation unit on the basis of a single received signal. In this case, it is therefore not only possible to determine whether an obstacle is present in one of the two monitoring regions, but also to determine in which of the monitoring regions, to be precise without the need to evaluate two signals with a temporal offset with respect to one another.

Thus, in one variant based thereon, provision is made, for example, for the two transmission electrodes to be actuated by alternating electric current with a phase shift with respect to one another. Therefore, when the displacement path of the vehicle closing element is free, a voltage signal which has a characteristic setpoint value (plus/minus a permissible tolerance value) is detectable at the single common reception electrode. If an obstacle appears in the displacement path of the moving vehicle closing element in one of the monitoring regions of the anti-trap system, the signal at a (common) reception electrode deviates in a characteristic manner from the setpoint value, so that it is thereby possible to draw a conclusion in respect of in the region of which of the transmission electrodes an obstacle has appeared.

A particularly simple possibility for judging in which of the monitoring regions an obstacle is present can be achieved by actuation of the transmission electrodes in phase opposition. In this case, the two transmission electrodes are preferably designed and arranged in such a way that, owing to the actuation in phase opposition, a measurable (at a common reception electrode) voltage signal is almost zero when there is no obstacle present. If an obstacle now appears in the region of one or other transmission electrode and the electrical capacitance is changed hereby, the capacitances measurable at the reception electrode no longer compensate for one another (completely), with the result that the mathematical sign of the voltage signal received via the reception electrode indicates the monitoring region in which an obstacle is present. Thus, owing to an obstacle in one of the monitoring regions, an electrical capacitance is only changed there, as a result of which the individual voltage signal at one reception electrode deviates from, is higher or lower than, the setpoint value in the case of a free displacement path. On the basis of the deviation, it is therefore possible to determine in the region of which transmission electrode an obstacle is present.

In a related variant embodiment, provision is made for one of the two transmission electrodes to be actuated by alternating current having a sinusoidal waveform, and for the other transmission electrode to be actuated simultaneously by alternating current having a cosinusoidal waveform. In this case too, it is possible to draw a conclusion in respect of in which of the two monitoring regions and therefore in the region of which transmission electrode an obstacle has appeared on the basis of a voltage signal at a common reception electrode for both transmission electrodes although both transmission electrodes are actuated simultaneously.

In a further embodiment, which can be provided by way of alternative or in addition to the abovementioned variant embodiments, in order to decide in which of the monitoring regions an obstacle is present, in the case of simultaneous actuation of the two transmission electrodes by alternating electric current, provision is made for a modulated carrier signal to be evaluated by the electronic evaluation unit. The two transmission electrodes are in this case actuated via a frequency multiplexer or by means of a quadrature amplitude modulation (also referred to as IQ modulation), for example, with the result that a single received (voltage) signal contains information both on the electrical capacitance in one monitoring region and on the electrical capacitance in the other monitoring region. By virtue of the modulation by means of a frequency multiplexer and/or IQ modulation, a received (modulated) signal therefore contains information as to whether the electrical capacitance in the region of one (first) transmission electrode and one reception electrode or the other (second) transmission electrode and one reception electrode has increased, which would mean that it would be necessary to assume that an obstacle is present in the respective associated monitoring region. On the basis of frequency, amplitude and/or phase modulation, therefore, it is possible to determine not only that but also where a change in capacitance has occurred and therefore to determine where an obstacle has been detected on the basis of a modulated carrier signal received via the reception electrode and a demodulator demodulating this received carrier signal in the electronic evaluation unit. Such information can be used not only for activating the anti-trap system, for example, but also for outputting a visual or audible alarm in respect of the location of the obstacle.

In principle, provision can of course be made for more than two transmission electrodes to be actuated and in particular evaluated with the aid of a single common reception electrode.

In accordance with a further aspect of the present invention, a method for controlling a capacitive anti-trap system of a vehicle is provided, in which the two transmission electrodes which are spaced physically apart from one another are operated in at least two different operating modes, wherein, in a first operating mode, it is possible to evaluate (by means of the electronic evaluation unit) whether an obstacle is present in one of the monitoring regions and, in a second operating mode, it is additionally possible to evaluate in which of the monitoring regions an obstacle is present.

The provision of such two different operating modes for an anti-trap system provides the advantage, for example, that, in a first operating mode, the appearance of an obstacle can be detected with increased time resolution and therefore simply more quickly, while, in the second operating mode, although in a targeted manner, a slightly slower and therefore more accurate detection with spatial resolution of an obstacle can take place.

This essential aspect of a method according to the invention as described above can in this case be combined readily with a variant embodiment which is based on the method of the first aspect of the invention.

For example, in the first operating mode, the two transmission electrodes are actuated simultaneously by alternating electric current via a single signal generator while, in the second operating mode, the two transmission electrodes are actuated separately from one another by alternating electric current, i.e. in time-alternating fashion or with a temporal offset with respect to one another.

In this case, provision can also be made in one development, for, in the second operating mode, the two transmission electrodes to be actuated by or subjected to alternating electric current by means of the same signal generator with a temporal offset with respect to one another, in the same way as in the first operating mode, in order to keep the number of electronic components as low as possible.

On the basis of a variant embodiment already explained above, in addition provision can alternatively or additionally be made for the two transmission electrodes to be actuated in phase in the first operating mode and in phase opposition in a second operating mode. In this case, the actuation in phase by alternating electric current is provided so that a (voltage) signal received via the reception electrode is added. As a result, any changes in capacitance can be determined more quickly, with the result that the anti-trap system is triggered earlier. In the case of actuation in phase opposition, a difference is again formed, as already explained above, with the result that scanning is more sensitive and, in the case of a change in capacitance owing to an obstacle, assessment with spatial resolution is possible on the basis of the mathematical sign of the received voltage signal to ascertain in which region of the vehicle closing element an obstacle is present.

Changeover between these two operating modes is preferably effected by means of at least one electronic switch. In this case, a variant embodiment in which the electronic switch is triggered by a switching signal which is generated by an obstacle detection device of the vehicle on identification of a potential obstacle in the region of the vehicle body opening is considered advantageous. Such an obstacle detection device identifies, for example by means of capacitive and/or optoelectronic sensors, whether a potential obstacle is present in the region of the vehicle body opening such that there is a risk of the closing vehicle closing element colliding with said obstacle. The obstacle detection device therefore takes effect and generates a switching signal before an actual obstacle in the displacement path of the vehicle closing element is detected via the anti-trap system and trapping is prevented. Therefore, the anti-trap system can switch, for example, from an operating mode in which the slower obstacle detection with spatial resolution is activated to an operating mode in which the detection with a quicker response and therefore without time resolution for a trapping situation is activated when a potential obstacle is identified in the region of the vehicle body opening already via the obstacle detection device. In such a variant embodiment, the switching between the two operating modes therefore takes place depending on whether a potential obstacle is identified by the obstacle detection device already before the actual detection of a trapping situation and therefore an obstacle in the closing vehicle closing element is to be expected with an increased probability of collision.

The generation of a switching signal for changeover from one operating mode (with a faster response) to the other (more sensitive) operating mode can take place in this case, for example, when a summated (voltage) signal which is detected via a reception electrode during actuation in phase of two transmission electrodes, exceeds a preset summation threshold value.

Part of an obstacle detection device via which the switchover to another operating mode can be triggered can be, for example, a camera device or at least one (parking) sensor at the rear of a motor vehicle.

A further aspect of the present invention consists in the provision of a capacitive anti-trap system which is preferably suitable for implementing one or both methods according to the invention. Such a capacitive anti-trap system in this case comprises at least two transmission electrodes and one reception electrode, wherein an electrical field is generated by a pair comprising transmission electrode and reception electrode by actuation of the respective transmission electrode by alternating electric current, said electrical field being influenced by an obstacle such that an electrical capacitance is measurably changed, and an electronic evaluation unit, by means of which a signal received via the at least one reception electrode can be evaluated to ascertain whether an electrical capacitance has changed as a result of an obstacle in the displacement path of the vehicle closing element.

In this case, the at least two transmission electrodes are arranged spaced physically apart from one another, preferably on the vehicle closing element to be displaced, so that, with a (the) associated reception electrode, they can generate an electrical field which can be influenced by an obstacle in two different monitoring regions. In addition, provision is made according to the invention for the electronic evaluation unit to be designed and intended to assess whether an obstacle is present in one of the two monitoring regions on the basis of a single received signal when the two transmission electrodes which are spaced physically apart from one another are actuated simultaneously by alternating electric current, and/or the two transmission electrodes which are spaced physically apart from one another to be capable of being operated in at least two different operating modes, wherein, in a first operating mode, it is possible to evaluate, by means of the electronic evaluation unit, whether an obstacle is present in one of the monitoring regions and, in a second operating mode, it is additionally possible to evaluate, by means of the electronic evaluation unit, in which of the monitoring regions an obstacle is present.

The advantages and features specified for a method according to the invention therefore also apply to a capacitive anti-trap system according to the invention, and vice versa.

In this case, it is preferred in principle for the two transmission electrodes to be provided on closing edges of the vehicle closing element which are spaced apart from one another and via each of which the vehicle closing element bears against the vehicle structure in the closed position of said vehicle closing element. Thus, at least two transmission electrodes are preferably arranged on different longitudinal sides of a motor vehicle tailgate, with the result that, if appropriate, it is possible to evaluate by means of the electronic evaluation unit whether an obstacle has appeared at a right-hand or left-hand edge of the tailgate.

In this context, it is also preferred if at least two transmission electrodes are designed to be axially symmetrical with respect to one another and extend at least partially along in each case one of the mutually opposite longitudinal closing edges of the vehicle closing element.

Furthermore, it will be mentioned that a motor-driven displacement of a vehicle closing element is understood to mean any displacement actuated by external force, i.e. in particular the displacement by means of an electric motor, hydraulic motor and/or pneumatic motor.

BRIEF DESCRIPTION OF THE DRAWINGS

Further advantages and features of the present invention will become clear in the description below relating to an exemplary embodiment with reference to the figures, in which:

FIGS. 3A-3B show a motor vehicle on which an anti-trap system as shown in FIG. 1 or 2 is provided in order to prevent trapping of an obstacle between a vehicle closing element in the form of a tailgate and a vehicle structure around the edge of a vehicle body opening.

FIG. 4 shows, partially schematically, an embodiment of an anti-trap system known from the prior art.

DETAILED DESCRIPTION

Figure 3A:
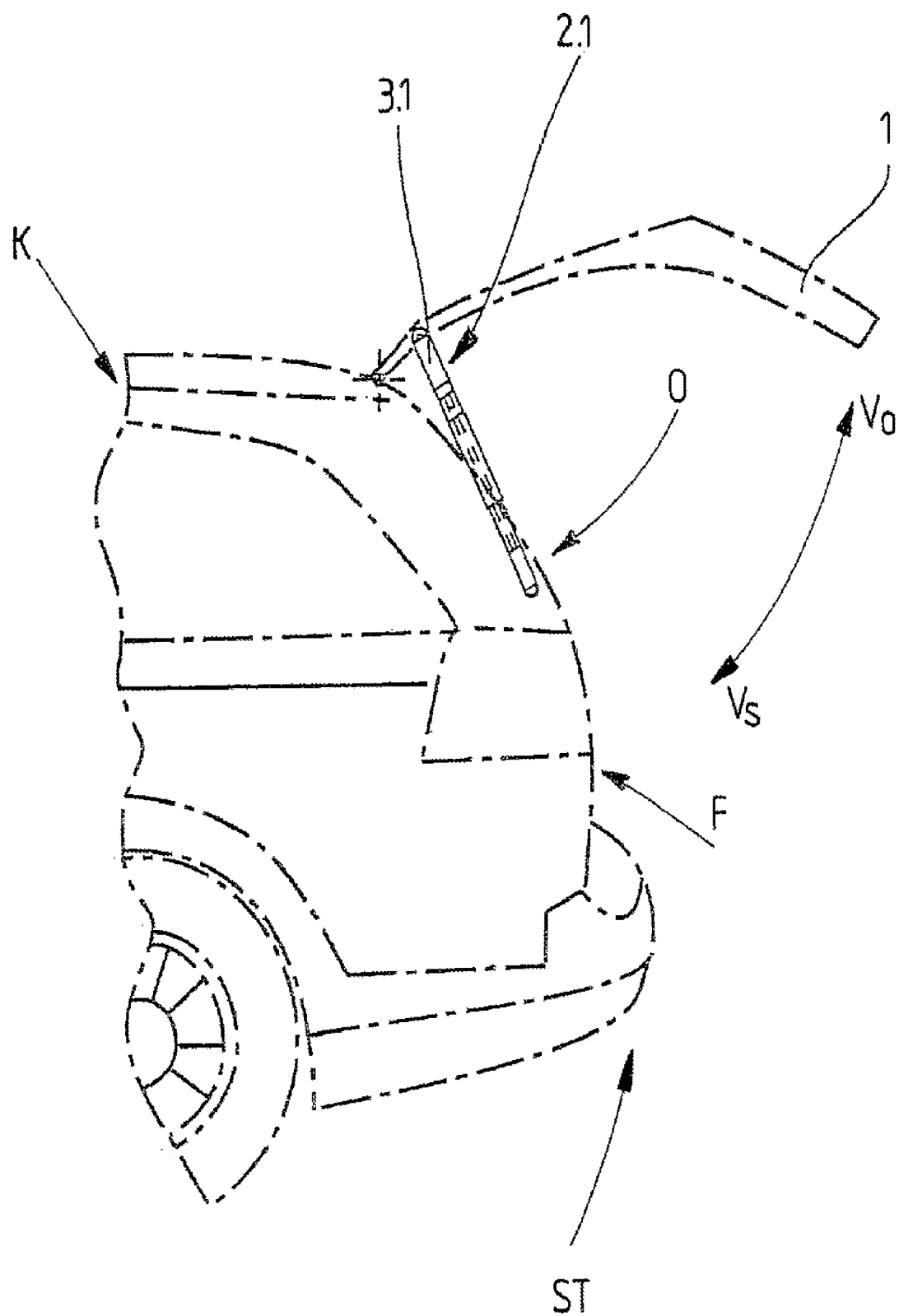

FIGS. 3A and 3B show a motor vehicle K having a tailgate 1 with motor-driven displaceability. In a closed position, in which the tailgate 1 is completely closed, the tailgate 1 closes a vehicle body opening O at the rear of the motor vehicle K, via which a loading area of the motor vehicle K is accessible. In this case, the tailgate 1 is displaceable automatically from an open position into a closed position along a displacement direction $V_S$ via a drive unit 2.1, 2.2. In this case, two drive units 2.1 and 2.2, which act on the tailgate 1, one on each longitudinal side of the tailgate, i.e. on the right or left, are provided for the symmetrical displacement of the tailgate 1. Each of these drive units 2.1, 2.2 has a drive motor 3.1, 3.2. The two drive motors 3.1, 3.2 are in this case controllable via an electronic control device in order to displace the tailgate 1 along the displacement direction $V_S$ into its closed position. In a variant embodiment, provision can additionally be made for the drive units 2.1, 2.2 to also be capable, by means of their drive motors 3.1, 3.2, of displacing the tailgate 1, which is articulated on the vehicle body of the motor vehicle, along an opposite displacement direction $V_O$ into a folded-down and therefore open position.

However, it is essential in the present case that the motor vehicle K and in particular the tailgate 1 is equipped with a capacitive anti-trap system in order to be able to automatically stop and/or reverse a displacement movement of the tailgate 1 during closing of the tailgate 1 if an obstacle (not illustrated) were to become trapped between a closing edge 11, 12, 13 of the tailgate 1 and a vehicle structure F around the edge of the vehicle body opening O. In the case of a tailgate 1 with motor-driven closeability, as is also the case for other vehicle closing elements, for example in the form of window panes, side doors or sliding roofs, there is the risk of in particular a body part of a person becoming trapped, which can result in considerable injury. In this case, a possible obstacle in the displacement path of the vehicle closing element, in this case the tailgate 1, is intended to be detected contactlessly as early as possible via an anti-trap system operating with a capacitive sensor system in order to prevent trapping of the respective obstacle. Such a capacitive anti-trap system can of course in this case also be supplemented by additional sensors, which detect the trapping of an obstacle in tactile fashion, for example.

In the present case, the anti-trap system has two elongate transmission electrodes S1, S2 and a common elongate reception electrode E. The reception electrode E in this case extends both over the two longitudinal-side closing edges 11 and 13 and over the transversely running closing edge 12 connecting said longitudinal-side closing edges of the tailgate 1 which, in the closed state, bears against the vehicle structure F in the region of a bumper ST of the motor vehicle K and which has a lock 4 in the center, which lock is provided for locking the tailgate 1. The two transmission electrodes S1 and S2 each run virtually completely along one of the longitudinal-side closing edges 11 and 13, respectively, and extend up to approximately the center of the transversely running, lower closing edge 12. The two transmission electrodes S1, S2 are not connected to one another at the lower closing edge 12, but have a spacing from one another. The two transmission electrodes S1, S2 are therefore separated from one another and spaced physically apart from one another.

Both the transmission electrodes S1, S2 and the reception electrode E run along the tailgate 1 in the region of its closing edges 11, 12, 13 and preferably within the tailgate 1, i.e., for example, beneath a protective plastic cover or a seal enveloping the electrodes.

The fact that in this case the transmission electrodes S1, S2 also extend partially along the lower closing edge 12 with the lock 4 provides the advantage that an obstacle between the lower closing edge 12 and part of the vehicle structure F in the region of the bumper ST or else between the lower closing edge 12 and the bumper ST can also be detected capacitively.

In an alternative variant embodiment, however, provision can of course also be made for the transmission electrodes S1, S2 not to extend or in each case at least not up to the center of the lower closing edge 12. Provision can likewise be made for there to be no reception electrode E which extends continuously over the entire length 1 of the lower closing edge 12. Instead, a variant is also conceivable in which a single reception electrode (of therefore at least two reception electrodes) to belong to each transmission electrode S1, S2, so that two electrode pairs which are spaced physically apart from one another, each comprising a transmission electrode and a single reception electrode, are formed on the tailgate 1.

In order to be able to detect an obstacle in the displacement path of the tailgate 1 during closing and therefore to prevent trapping of the obstacle effectively, the two transmission electrodes S1, S2 are actuated by alternating electric current. As a result, an electric field is generated in each case which is influenced by an obstacle such that an electrical capacitance is measurably changed. A change in the electrical capacitance is then in this case detectable via the one common reception electrode E, with the result that it is possible to automatically evaluate whether an obstacle is present in the region of the respective transmission electrode S1, S2 via an electronic evaluation unit, which is electrically connected to the reception electrode E, by means of evaluation logic.

FIG. 4 shows, schematically, the design of an electronic evaluation unit 5* known from the prior art. This electronic evaluation unit 5* in this case comprises not only components connected to the reception electrode E, such as a reception amplifier 5.4 and an evaluation circuit 5.5 (with integrated evaluation logic or with coupling to evaluation logic), via which a voltage signal received via the reception electrode E can be amplified and evaluated in order to determine the occurrence of an obstacle in the displacement path of the tailgate 1. Instead, in the present variant embodiment, components connected to the transmission electrodes S1, S2 of the electronic evaluation unit 5\* are also included. These components, which are connected to the transmission electrodes S1, S2 and which implement the actuation of the transmission electrodes S1, S2 by alternating electric current, are a signal generator 5.1, and amplifier 5.2 connected downstream of this signal generator 5.1 and an analog multiplexer 5.3\* following the amplifier 5.2.

In this case, alternating current with a preset amplitude and frequency is generated via the signal generator 5.1, and this alternating current is passed on, in temporally alternating fashion, to the transmission electrode S1 or the transmission electrode S2 via the amplifier 5.2 and the analog multiplexer 5.3\*. An alternating current with a preset amplitude and frequency is transmitted optionally to the (first) transmission electrode S1 or to the (second) transmission electrode S2 via the illustrated setup with an analog multiplexer 5.3\* so that it is possible to assess, on the basis of signals received successively via the evaluation circuit 5.5, whether a change in the electrical capacitance has occurred at the first transmission electrode S1 or at the second transmission electrode S2 which makes it possible to conclude that an obstacle is present in the displacement path of the tailgate 1. Therefore, a measurement of a plurality of sensor channels in the time multiplex is implemented here in order to be able to determine, with spatial resolution, in which of the monitoring regions defined by in each case one transmission electrode S1, S2 on the tailgate 1 the collision with an obstacle occurs when the displacement movement of the tailgate 1 is not stopped and/or reversed.

Figure 1:
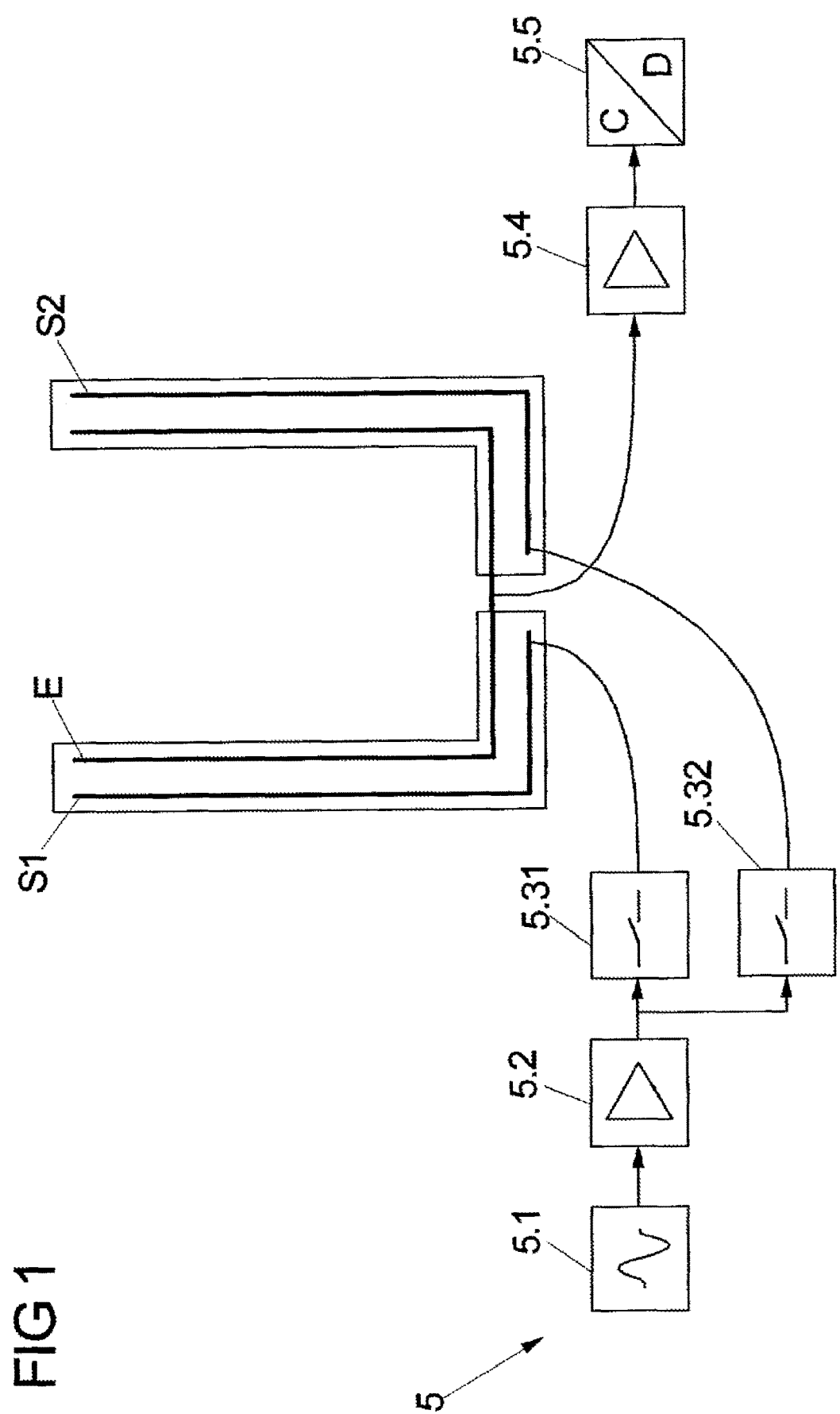
FIG. 1 shows, partially schematically, a first variant embodiment of an anti-trap system according to the invention, in which two transmission electrodes are operable in two different operating modes.

FIG. 1 illustrates schematically a first variant embodiment of an anti-trap system according to the invention, which implements a method according to the invention.

In this case, an evaluation unit 5 is provided which has two analog switches 5.31 and 5.32 instead of the analog multiplexer 5.3\*. The two transmission electrodes S1 and S2 are operable in two different operating modes via these analog switches 5.31 and 5.32. In this case, in a first operating mode, the two transmission electrodes S1, S2 are actuated parallel and simultaneously via one signal generator 5.2, with the result that changes in the capacitance in the two monitoring regions, i.e. in particular at the right-hand and left-hand closing edges 11 and 13 of the tailgate, can be determined at one common reception electrode E. Owing to the fact that the two transmission electrodes S1, S2 are connected in parallel, comparatively quick detection of an obstacle is therefore enabled, for example with twice the frequency in comparison with a second operating mode, since any change in capacitance owing to an obstacle in the region of the tailgate 1 is determinable immediately and not first when the respective transmission electrode S1 or S2 at whose associated closing edges 11 or 13 the tailgate 1 possibly (critically) collides with the obstacle is actuated again.

In the second operating mode, the transmission electrodes S1, S2 are actuated in temporally alternating fashion by means of the two analog switches 5.31 and 5.32. As a result, the detection of an obstacle is performed slightly more slowly in comparison with the first operating mode, but with a greater sensitivity and with spatial resolution. It is therefore possible to evaluate which transmission electrode S1, S2 is subject to the appearance of the obstacle in the monitoring region thereof which has triggered stopping and/or reversing of the displacement movement of the tailgate 1, via the evaluation circuit 5.5.

By virtue of the provision of the two operating modes, it is therefore possible to adapt variably to different situations, for example. In this case, for example, provision can be made for switchover from the second operating mode to the first operating mode to be performed via an electronic switch when a potential obstacle in the region of the vehicle body opening O is determined via an obstacle detection device (not illustrated) on the motor vehicle K. The obstacle detection device in this case generates a switching signal, which is used for switchover to the other operating mode when there is an increased risk of an actual collision between the closing tailgate 1 and an obstacle owing to a potential obstacle in the region of the vehicle body opening O.

Figure 2:
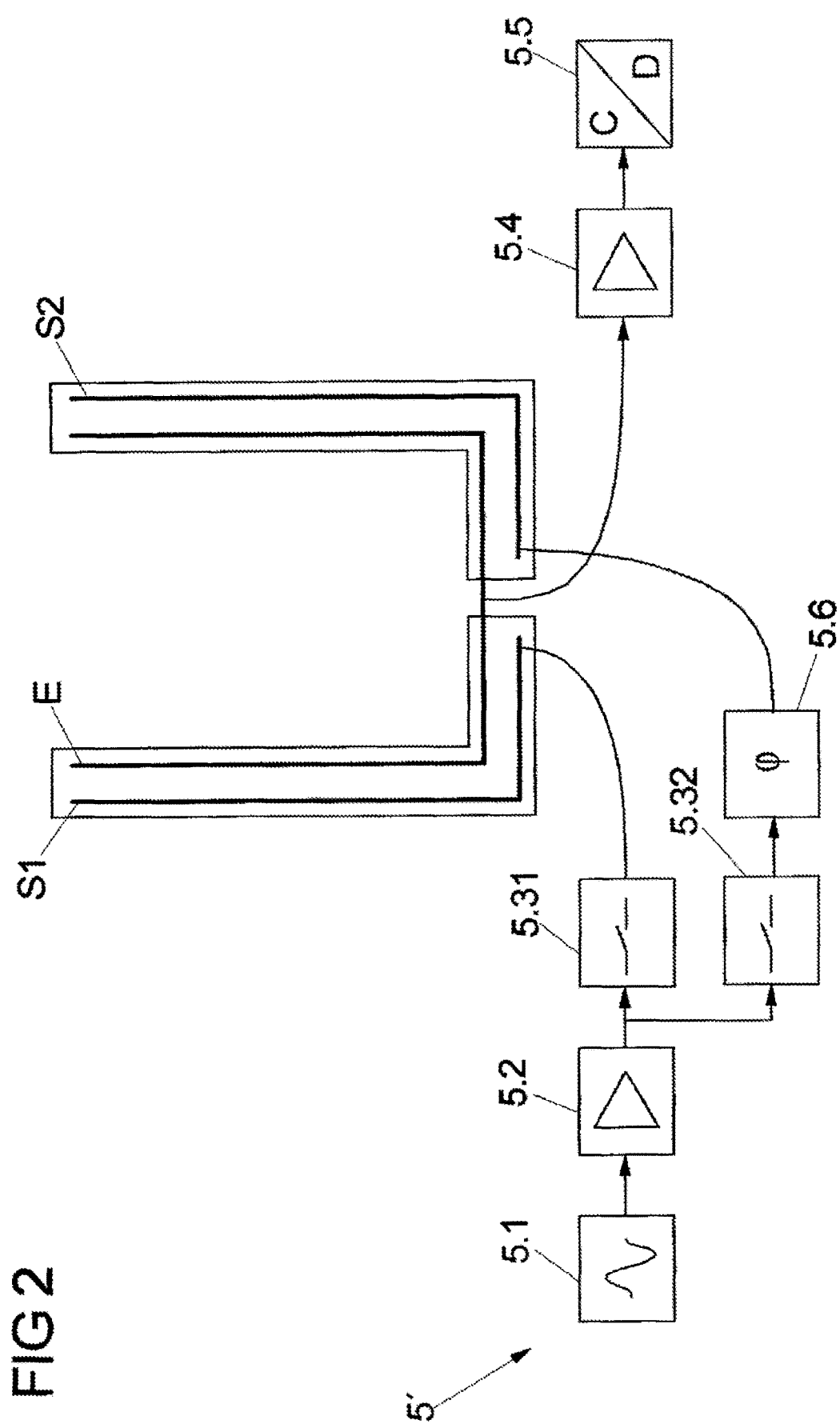
FIG. 2 shows, partially schematically, a second variant embodiment of an anti-trap system according to the invention, in which the two transmission electrodes are operable in at least two different operating modes and can be actuated with a phase shift with respect to one another.

While in the variant embodiment in FIG. 1 only between a first operating mode, in which a summation over a plurality of sensor channels takes place in order to provide a quicker measurement time, and a second operating mode, with the possibility of individual measurement with increased sensitivity, is implemented, in the second variant embodiment in FIG. 2 additional means in the form of at least one phase shifter 5.6 are also provided as part of an evaluation unit 5'. These means make it possible for the evaluation logic of the evaluation unit 5' to be able to assess whether and in which of the two monitoring regions belonging to in each case one transmission electrode S1, S2 an obstacle is present already on the basis of a single received voltage signal.

In this case, the two transmission electrodes S1, S2 are still operable and actuable in two different operating modes via the provided analog switches 5.31 and 5.32. In the second operating mode, in which it is additionally possible to evaluate in which of the monitoring regions an obstacle is present, the two transmission electrodes S1, S2 are not actuated here with a temporal offset with respect to one another, however. Instead, one (in this case the second) transmission electrode S2 can be actuated by an alternating current (signal) which is preferably phase-shifted through 180° by means of the phase shifter 5.6. If, however, alternating electric current is applied simultaneously in phase opposition to the two transmission electrodes S1, S2, owing to the symmetrical design of the two transmission electrodes S1, S2 with respect to one another the voltage signal which can be received at the reception electrode E is almost zero when no obstacle is present. If, however, an obstacle now appears in the region of one of the transmission electrodes S1, S2 and the respective capacitance is changed thereby, the content of one of the two transmission electrodes S1, S2 in the voltage signal is predominant. This means that it is possible to evaluate directly in which of the monitoring regions an obstacle has appeared by means of the evaluation unit 5'. It is already possible to assess this automatically in the event of the appearance of an obstacle on the basis of the mathematical sign of a voltage signal deviating from the original (setpoint) voltage signal.

A first operating mode which is likewise possible with the variant embodiment in FIG. 2, in which operating mode the two transmission electrodes S1, S2 are actuated in parallel and in phase so as to increase the measurement speed, can be implemented here by simple deactivation of the phase shifter 5.6, for example.

Furthermore, yet a third operating mode is of course also possible here, in which the phase shifter 5.6 is deactivated and the two transmission electrodes S1, S2 are actuated in temporally alternating fashion via the two analog switches 5.31 and 5.32 corresponding to the variant in FIG. 1. In the case of the presence of a phase shifter 5.6, however, the previously mentioned possibility with actuation in phase opposition of the two transmission electrodes S1, S2 for scanning with spatial resolution for the presence of an obstacle is preferable since, as a result, a basic capacitance which would need to be taken into consideration for the evaluation otherwise is thus also eliminated. Thus, the basic capacitance is automatically compensated for by the actuation in phase opposition of the mutually symmetrical transmission electrodes S1, S2 and the resultant formation of the difference in the voltage signal received by the reception electrode E.

On the basis of the variant embodiment from FIG. 2, in addition a further development is also possible, in which likewise (in a second operating mode) detection with spatial resolution on the basis of a single voltage signal received and evaluated via the reception electrode E is possible. Thus, the two transmission electrodes S1, S2 can be actuated simultaneously by alternating electric current via a single signal generator 5.1 by means of a frequency multiplexer and/or via a quadrature amplitude modulation (also referred to as IQ modulation). As a result, evaluation with spatial resolution for the two transmission electrodes S1, S2 can then take place on the basis of a modulated carrier signal received via the reception electrode E. Thus, only one demodulator needs to be provided here on the receiver side and possibly upstream of the evaluation circuit 5.6 in order to demodulate the received carrier signal and to evaluate the respectively demodulated signals to ascertain whether a change in the electrical capacitance in the respective monitoring region is determinable here.

In a variant embodiment on this basis, provision can be made, for example, for the two transmission electrodes S1, S2 to be evaluated simultaneously, but independently of one another, by means of orthogonal signals (phase shift of 90°) and an IQ demodulator.

The actual evaluation is performed in each case in particular with the aid of the evaluation circuit 5.5 of the evaluation unit 5, 5'. In this case, a capacitance signal or a plurality of capacitance signals, which are each representative of a transmission electrode S1, S2, are obtained via the evaluation circuit 5.5 from a received and possibly demodulated voltage signal, and the respective capacitance signal is converted into a digital signal in order to hereby control the stopping and/or reversing of the displacement movement of the tailgate 1.

The invention claimed is:

1. A method for controlling a capacitive anti-trap system of a vehicle to detect an obstacle in a displacement path of a vehicle closing element and to prevent the obstacle from being trapped between the closing vehicle closing element and a vehicle structure defining a vehicle body opening which is closed by the vehicle closing element in a closed position, the method comprising:
   actuating at least two transmission electrodes simultaneously by an alternating current via a frequency multiplexer to generate an electrical field in the displacement path which can be influenced by the obstacle being in at least one of at least two different monitoring regions, the electrical field being between each respective one of the at least two transmission electrodes and a reception electrode during closing of the vehicle closing element, wherein an electrical capacitance of the electrical field is configured to be measurably changed due to an obstacle being in at least one of the at least two monitoring regions;
   receiving a single signal via the reception electrode, the simultaneous actuation of the at least two transmission electrodes resulting in the single signal being indicative of an obstacle in one of the at least two monitoring regions; and
   evaluating the single signal using an electronic evaluation unit to determine whether an obstacle is present in one of the at least two monitoring regions,
   wherein the at least two transmission electrodes are actuated simultaneously by alternating electric current such that it is possible to assess in which of the at least two monitoring regions an obstacle is present via the electronic evaluation unit on the basis of the single signal,
   wherein the at least two transmission electrodes are actuated in phase opposition, and
   wherein the at least two transmission electrodes are configured such that, owing to the actuation in phase opposition, a measurable voltage signal is almost zero when there is no obstacle present and the mathematical sign of the received voltage signal indicates the monitoring region in which an obstacle is present.

2. The method as claimed in claim 1, wherein one of the at least two transmission electrodes is actuated by alternating current having a sinusoidal waveform, and another of the at least two other transmission electrodes is actuated simultaneously by alternating current having a cosinusoidal waveform.

3. The method as claimed in claim 1, wherein the electronic evaluation unit comprises a demodulator configured to demodulate a received carrier signal and configured to evaluate in which of the monitoring regions an obstacle is present on the basis of the demodulated signal.

4. The method as claimed in claim 1, wherein the at least two transmission electrodes are spaced physically apart from one another so that, with the at least one reception electrode, they are configured to generate an electrical field which can be influenced by an obstacle in two different monitoring regions, and wherein the two transmission electrodes are configured to be operated in at least two different operating modes, wherein, in a first operating mode, it is possible to evaluate whether an obstacle is present in one of the monitoring regions and, in a second operating mode, it is additionally possible to evaluate in which of the monitoring regions an obstacle is present.

5. The method as claimed in claim 4, wherein, in the first operating mode, the two transmission electrodes are actuated simultaneously by alternating electric current via a single signal generator and, in the second operating mode, the two transmission electrodes are actuated separately from one another by alternating electric current.

6. The method as claimed in claim 5, wherein, in the second operating mode, the two transmission electrodes are actuated by alternating electric current via the single signal generator with a temporal offset with respect to one another.

7. The method as claimed in claim 4, wherein, in the first operating mode, the two transmission electrodes are actuated in phase and, in a second operating mode, said transmission electrodes are actuated in phase opposition.

8. The method as claimed in claim 4, wherein changeover between the first and second operating modes can be effected via at least one electronic switch.

9. The method as claimed in claim 8, wherein the electronic switch is triggered by a switching signal which is configured to be generated by an obstacle detection device of the vehicle on identification of a potential obstacle in the region of the vehicle body opening.

10. A method for controlling a capacitive anti-trap system of a vehicle to detect an obstacle in a displacement path of a vehicle closing element and to prevent the obstacle from being trapped between the closing vehicle closing element and a vehicle structure defining a vehicle body opening which is closed by the vehicle closing element in a closed position, the method comprising:

actuating at least two transmission electrodes simultaneously by an alternating current via quadrature amplitude modulation to generate an electrical field in the displacement path which can be influenced by the obstacle being in at least one of at least two different monitoring regions, the electrical field being between each respective one of the at least two transmission electrodes and a reception electrode during closing of the vehicle closing element, wherein an electrical capacitance of the electrical field is configured to be measurably changed due to an obstacle being in at least one of the at least two monitoring regions;

receiving a single signal via the reception electrode, the simultaneous actuation of the at least two transmission electrodes resulting in the single signal being indicative of an obstacle in one of the at least two monitoring regions; and evaluating the single signal using an electronic evaluation unit to determine whether an obstacle is present in one of the at least two monitoring regions, wherein the at least two transmission electrodes are actuated simultaneously by alternating electric current such that it is possible to assess in which of the at least two monitoring regions an obstacle is present via the electronic evaluation unit on the basis of the single signal, wherein the at least two transmission electrodes are actuated in phase opposition, and wherein the at least two transmission electrodes are configured such that, owing to the actuation in phase opposition, a measurable voltage signal is almost zero when there is no obstacle present and the mathematical sign of the received voltage signal indicates the monitoring region in which an obstacle is present.

11. The method as claimed in claim 10, wherein one of the at least two transmission electrodes is actuated by alternating current having a sinusoidal waveform, and another of the at least two other transmission electrodes is actuated simultaneously by alternating current having a cosinusoidal waveform.

12. A capacitive anti-trap system for a vehicle, wherein the anti-trap system comprises: at least two transmission electrodes and at least one reception electrode, wherein an electrical field is configured to be generated by a pair comprising one of the at least two transmission electrodes and one of the at least one reception electrodes by actuation of the transmission electrode by alternating electric current, said electrical field being configured to be influenced by an obstacle such that an electrical capacitance is measurably changed; and an electronic evaluation unit, via which a signal received via a reception electrode can be evaluated to ascertain whether an electrical capacitance has changed as a result of an obstacle in the displacement path of the vehicle closing element, wherein the at least two transmission electrodes are spaced physically apart from one another so that, with the at least one reception electrode, they can generate an electrical field which can be influenced by an obstacle in two different monitoring regions, and wherein the electronic evaluation unit is designed and intended to assess whether an obstacle is present in one of the two monitoring regions on the basis of a single received signal when the two transmission electrodes are actuated simultaneously by alternating electric current via a frequency multiplexer, and wherein the two transmission electrodes can be operated in at least two different operating modes, wherein, in a first operating mode, it is possible to evaluate, via the electronic evaluation unit, whether an obstacle is present in one of the monitoring regions and, in a second operating mode, it is additionally possible to evaluate, via the electronic evaluation unit, in which of the monitoring regions an obstacle is present;

wherein the capacitive anti-trap system is controlled by the method of claim 1.

13. The anti-trap system as claimed in claim 12, wherein the at least two transmission electrodes are provided on closing edges of the vehicle closing element and via each of which the vehicle closing element bears against the vehicle structure in the closed position of said vehicle closing element.

* * * * *